(12) United States Patent
Wei et al.

(10) Patent No.: US 9,792,544 B2
(45) Date of Patent: Oct. 17, 2017

(54) INTERPOSER AND ELECTRONIC COMPONENT

(71) Applicant: Huawei Technologies Co., Ltd., Shenzhen (CN)

(72) Inventors: Xingchang Wei, Hangzhou (CN); Huichun Yu, Shenzhen (CN); Xiaobo Huang, Shenzhen (CN); Xingyun Luo, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 9 days.

(21) Appl. No.: 14/983,259

(22) Filed: Dec. 29, 2015

(65) Prior Publication Data

US 2016/0253585 A1 Sep. 1, 2016

(30) Foreign Application Priority Data

Feb. 27, 2015 (CN) .......................... 2015 1 0091433

(51) Int. Cl.
*G06K 19/06* (2006.01)
*G06K 19/077* (2006.01)
(Continued)

(52) U.S. Cl.
CPC ....... *G06K 19/0776* (2013.01); *G06K 19/041* (2013.01); *H01L 23/147* (2013.01);
(Continued)

(58) Field of Classification Search
CPC .. H01L 21/76898; H01L 23/48; H01L 23/481
See application file for complete search history.

(56) References Cited

U.S. PATENT DOCUMENTS 8,338,961 B2 * 12/2012 Su ..................... H01L 21/76898
257/774
9,018,969 B2 * 4/2015 Ishikawa .............. G11C 29/025
257/774
(Continued)

OTHER PUBLICATIONS

Li et al., "Double-Shielded Interposer With Highly Doped Layers for High-Speed Signal Propagation," IEEE Transactions on Electromagnetic Compatibility, vol. 56, Issue 5, pp. 1210-1217, Institute of Electrical and Electronics Engineers, New York, New York (Oct. 2014).

*Primary Examiner* — Thien M Le
*Assistant Examiner* — April Taylor
(74) *Attorney, Agent, or Firm* — Leydig, Voit & Mayer, Ltd.

(57) ABSTRACT

The present application provides an interposer, including an interposer substrate, at least one through silicon via, a first shield layer, a first insulation layer, a first cable layout layer, and at least one first bump. The interposer substrate includes an upper surface and a lower surface; the at least one through silicon via is buried in the interposer substrate and runs through the upper surface and the lower surface; the first shield layer is disposed on the upper surface of the interposer substrate and the first shield layer has electrical conductivity; the first insulation layer is disposed at the first shield layer; the first cable layout layer is disposed at the first insulation layer and is electrically connected to the at least one through silicon via.

19 Claims, 6 Drawing Sheets

(51) Int. Cl.
*H01L 23/14* (2006.01)
*H01L 23/552* (2006.01)
*G06K 19/04* (2006.01)
*H01L 23/498* (2006.01)

(52) U.S. Cl.
CPC ...... *H01L 23/49827* (2013.01); *H01L 23/552* (2013.01); *H01L 23/49816* (2013.01)

(56) References Cited

U.S. PATENT DOCUMENTS

| 9,368,482 | B2* | 6/2016 | Kim | H01L 23/481 |
| 2010/0244223 | A1* | 9/2010 | Cho | H01L 23/3128 |
| | | | | 257/690 |
| 2014/0183755 | A1 | 7/2014 | Huang et al. | |
| 2016/0365335 | A1* | 12/2016 | Black | H01L 23/481 |
| 2017/0018523 | A1* | 1/2017 | Yu | H01L 24/13 |

* cited by examiner

INTERPOSER AND ELECTRONIC COMPONENT

CROSS-REFERENCE TO RELATED APPLICATIONS

This application claims priority to Chinese Patent Application No. 201510091433.7, filed on Feb. 27, 2015, which is hereby incorporated by reference in its entirety.

TECHNICAL FIELD

The present application relates to the field of circuit technologies, and in particular, to an interposer and an electronic component.

BACKGROUND

With the development of semiconductor technologies and integrated circuits, a character size of a CMOS (Complementary-Metal-Oxide-Semiconductor, complementary-metal-oxide-semiconductor) device is reduced dramatically. Improving system performance of a conventional two-dimensional integrated circuit by reducing a size of a device is increasingly limited. An interposer provided with a TSV (through silicon via) is an effective method for resolving the foregoing problem of devices integration because of high packaging density and excellent performance of the interposer provided with a TSV. However, a conventional TSV interposer propagates a signal in a manner of providing a return current for the signal by using a TSV ground, and in a signal transmission structure, an electromagnetic field generated by the TSV and a cable layout layer penetrates into a silicon substrate of the interposer, thereby causing problems of signal attenuation and interference leakage.

SUMMARY

Embodiments of the disclosure provide an interposer, so as to maintain integrity of a signal in a transmission process and prevent interference leakage of the signal.

A first aspect of the present application provides an interposer, where the interposer includes:

an interposer substrate, where the interposer substrate includes an upper surface and a lower surface;

at least one through silicon via, where the at least one through silicon via is buried in the interposer substrate and runs through the upper surface and the lower surface of the interposer substrate;

a first shield layer, where the first shield layer is disposed on the upper surface of the interposer substrate and the first shield layer has electrical conductivity;

a first insulation layer, where the first insulation layer is disposed at the first shield layer;

a first cable layout layer, where the first cable layout layer is disposed at the first insulation layer and is electrically connected to one or more through silicon vias of the at least one through silicon via; and at least one first bump, where the at least one first bump is disposed at the first cable layout layer, so as to be electrically connected to the at least one through silicon via by using the first cable layout layer.

In a first possible implementation manner of the first aspect, the at least one first bump is connected, in a one-to-one corresponding manner, to one or more through silicon vias of the at least one through silicon via.

With reference to the first possible implementation manner of the first aspect, in a second possible implementation manner of the first aspect, the first shield layer is electrically connected to one or more through silicon vias of the at least one through silicon via.

With reference to the first possible implementation manner of the first aspect, in a third possible implementation manner of the first aspect, the first shield layer is insulated from the at least one through silicon via.

With reference to any one of the first to the third possible implementation manners of the first aspect, in a fourth possible implementation manner of the first aspect, the interposer further includes:

a second shield layer, where the second shield layer is disposed on the lower surface of the interposer substrate and the second shield layer has electrical conductivity;

a second insulation layer, where the second insulation layer is disposed at the second shield layer;

a second cable layout layer, where the second cable layout layer is disposed at the second insulation layer and is electrically connected to one or more of the at least one through silicon via; and at least one second bump, where the at least one second bump is disposed at the second cable layout layer, so as to be electrically connected to the at least one through silicon via by using the second cable layout layer.

With reference to the fourth possible implementation manner of the first aspect, in a fifth possible implementation manner of the first aspect, the first shield layer or the second shield layer is electrically connected to one or more through silicon vias of the at least one through silicon via.

With reference to the fourth possible implementation manner of the first aspect, in a sixth possible implementation manner of the first aspect, the first shield layer and the second shield layer are separately electrically connected to one or more through silicon vias of the at least one through silicon via, and the one or more through silicon vias, of the at least one through silicon via, connected to the first shield layer are different from the one or more through silicon vias, of the at least one through silicon via, connected to the second shield layer.

With reference to the fourth possible implementation manner of the first aspect, in a seventh possible implementation manner of the first aspect, one or more through silicon vias of the at least one through silicon via are electrically connected to both the first shield layer and the second shield layer, so that the interposer forms an equipotential body.

With reference to the seventh possible implementation manner of the first aspect, in an eighth possible implementation manner of the first aspect, when the second bump is connected to a ground plane of a printed circuit board, the one or more through silicon vias, of the at least one through silicon via, electrically connected to both the first shield layer and the second shield layer are further electrically connected to the ground plane.

With reference to the fourth possible implementation manner of the first aspect, in a ninth possible implementation manner of the first aspect, both the first shield layer and the second shield layer are insulated from the at least one through silicon via.

With reference to any one of the fourth to the ninth possible implementation manners of the first aspect, in a tenth possible implementation manner of the first aspect, the interposer further includes: a third insulation layer, where the third insulation layer is disposed between the first shield layer and the upper surface of the interposer substrate; and a fourth insulation layer, where the fourth insulation layer is disposed between the second shield layer and the lower surface of the interposer substrate.

With reference to the tenth possible implementation manner of the first aspect, in an eleventh possible implementation manner of the first aspect, the third insulation layer and the fourth insulation layer include doping ions.

With reference to the eleventh possible implementation manner of the first aspect, in a twelfth possible implementation manner of the first aspect, doping densities of the doping ions at the third insulation layer and the fourth insulation layer are greater than $10^{17}/cm^3$.

With reference to any one of the fourth to the twelfth possible implementation manners of the first aspect, in a thirteenth possible implementation manner of the first aspect, the first shield layer and the second shield layer are provided with a hollowed-out part.

With reference to the thirteenth possible implementation manner of the first aspect, in a fourteenth possible implementation manner of the first aspect, the first shield layer and the second shield layer are of a lattice structure formed by braiding metallic wires, where widths of the metallic wires are greater than 10 um, and a distance between neighboring metallic wires is greater than 0 and less than 100 um.

With reference to any one of the fourth to the fourteenth possible implementation manners of the first aspect, in a fifteenth possible implementation manner of the first aspect, the at least one second bump is connected, in a one-to-one corresponding manner, to one or more through silicon vias of the at least one through silicon via.

A second aspect of the disclosure further provides an electronic component, including a first electronic part, a second electronic part, and the interposer according to any one of the foregoing possible implementation manners of the first aspect, where both the first electronic device and the second electronic device are disposed on the interposer, to be electrically interconnected by using the interposer.

In a first possible implementation manner of the second aspect, the at least one first bump includes a first group of first bumps and a second group of first bumps, where the first group of first bumps includes one or more first bumps of the at least one first bump, the second group of first bumps includes one or more first bumps of the at least one first bump, and the one or more first bumps, of the at least one first bump, included in the first group of first bumps are different from the one or more first bumps, of the at least one first bump, included in the second group of first bumps; and both the first electronic device and the second electronic device are disposed on top of the interposer, the first electronic device is connected to the first group of first bumps, the second electronic device is connected to the second group of first bumps, and the first electronic device and the second electronic device are electrically interconnected by using the first group of first bumps, the second group of first bumps, and a first cable layout layer.

In a second possible implementation manner of the second aspect, the first electronic device is disposed on top of the interposer and is electrically connected to one or more first bumps of at least one first bump, the second electronic device is disposed at the bottom of the interposer and is electrically connected to one or more second bumps of at least one second bump, and the first electronic device and the second electronic device are electrically interconnected by using the one or more first bumps, a first cable layout layer, a corresponding through silicon via, a second cable layout layer, and the one or more second bumps.

In a third possible implementation manner of the second aspect, the electronic component further includes a printed circuit board, where the first electronic part, the second electronic part, and the printed circuit board communicate by using the interposer.

It may be learned from the foregoing technical solutions that, the interposer according to the embodiments of the disclosure includes an interposer substrate, at least one through silicon via, a first shield layer, a first insulation layer, a first cable layout layer, and at least one first bump. The interposer substrate includes an upper surface and a lower surface; the at least one through silicon via is buried in the interposer substrate and runs through the upper surface and the lower surface of the interposer substrate; the first shield layer is disposed on the upper surface of the interposer substrate and the first shield layer has electrical conductivity; the first insulation layer is disposed at the first shield layer; the first cable layout layer is disposed at the first insulation layer and is electrically connected to one or more through silicon vias of the at least one through silicon via; and the at least first bump is disposed at the first cable layout layer, so as to be electrically connected to a corresponding through silicon via by using the first cable layout layer. The interposer includes the first shield layer, and the first shield layer is disposed between the upper surface of the interposer substrate and the first cable layout layer and is configured to block and reflect an electromagnetic wave generated at the first cable layout layer, thereby reducing penetration, of an electromagnetic field generated at the first cable layout layer, into the interposer substrate, so that integrity of a signal is maintained, and electromagnetic interference leakage is reduced.

BRIEF DESCRIPTION OF DRAWINGS

To describe the technical solutions in embodiments of the disclosure more clearly, the following briefly introduces the accompanying drawings required for describing the embodiments. Apparently, the accompanying drawings in the following description show merely some embodiments of the disclosure, and persons of ordinary skill in the art may still derive other drawings from these accompanying drawings without creative efforts.

DESCRIPTION OF EMBODIMENTS

Embodiments of the disclosure provide an interposer and an electronic component.

To make the objectives, features, and advantages of the present application more obvious and comprehensible, the following clearly describes the technical solutions in embodiments of the disclosure with reference to the accompanying drawings in the embodiments of the disclosure. Apparently, the embodiments described in the following are merely some rather than all of the embodiments of the disclosure. All other embodiments obtained by persons of ordinary skill in the art based on the embodiments of the disclosure without creative efforts shall fall within the protection scope of the present application.

Terms such as "first", "second", "third", and "fourth" (if exist) in the specification, the claims, and the foregoing drawings of the present application are used to distinguish between similar objects, and are not necessarily used to describe a specific sequence or a sequence of priority. It should be understood that numbers used in this way are interchangeable in a suitable situation, so that the embodiments of the disclosure described herein can, for example, be implemented in a sequence in addition to a sequence shown or described herein. In addition, terms such as "include" and "be provided" and any variation thereof are intended to cover non-exclusive inclusion, for example, processes, methods, systems, products, or devices including a series of steps or units are not necessarily limited to the steps and units that are clearly listed and may include other steps or units that are not clearly listed or that are inherent in the processes, methods, products, or devices.

Specific embodiments are separately described in detail in the following.

Figure 1:
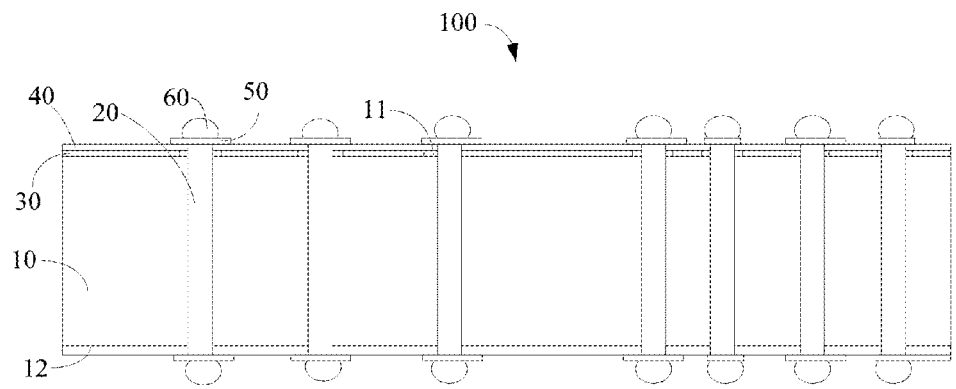
FIG. 1 is a schematic diagram of an interposer according to a first embodiment of a first solution of the disclosure.

Referring to FIG. 1, a first embodiment of a first solution of the disclosure provides an interposer 100. The interposer 100 is configured to connect electronic parts or connect an electronic device and a printed circuit board, to provide an electrical interconnection between the electronic parts or between the electronic device and the printed circuit board. The interposer 100 includes an interposer substrate 10, at least one through silicon via 20, a first shield layer 30, a first insulation layer 40, a first cable layout layer 50, and at least one first bump 60.

The interposer substrate 10 includes an upper surface 11 and a lower surface 12. The interposer substrate may be a silicon substrate, and in addition, a low-resistance silicon substrate.

The at least one through silicon via 20 is buried in the interposer substrate 10 and runs through the upper surface 11 and the lower surface 12 of the interposer substrate 10.

It should be noted that, in an embodiment, to make the at least one through silicon via 20, a deep reactive ion etching technology or another technology is used to form a through via on the silicon substrate. After the through via is made, a thin insulation layer is formed on a side wall of the through via. Then, a copper layer is plated in the through via to form an interconnection structure in a vertical direction, so that vertical transmission of a signal can be performed.

The first shield layer 30 is disposed on the upper surface 11 of the interposer substrate 10 and the first shield layer 30 has electrical conductivity. In this embodiment, the first shield layer 30 is a metallic shield layer and may be further a metallic copper shield layer.

The first insulation layer 40 is disposed on the first shield layer 30.

The first cable layout layer 50 is disposed on the first insulation layer 40 and is electrically connected to one or more through silicon vias 20 of the at least one through silicon via 20.

It should be noted that, the first insulation layer 40 is configured to insulate the first shield layer 30 from the first cable layout layer 50. A function of the first cable layout layer 50 is to implement signal transmission in a horizontal direction.

For the at least one first bump 60, the at least one first bump 60 is disposed on the first cable layout layer 50, so as to be electrically connected to the at least one through silicon via 20 by using the first cable layout layer. In this embodiment, the at least one first bump 60 is connected, in a one-to-one corresponding manner, to one or more through silicon vias 20 of the at least one through silicon via 20. When one or more first bumps 60 of the at least one first bump 60 are electrically connected to an electronic part, the electronic device is electrically connected to the first cable layout layer 50 and the corresponding through silicon via 20.

The at least one first bump 60 may be a solder ball or a micro solder ball.

In this embodiment, an interposer 100 includes a first shield layer 30. The first shield layer 30 is disposed between an upper surface 11 of an interposer substrate 10 and a first cable layout layer 50 and is configured to block and reflect an electromagnetic wave generated at the first cable layout layer 50, thereby reducing penetration, of an electromagnetic field generated at the first cable layout layer 50, into the interposer substrate 10. Therefore, the interposer 100 improves integrity of a signal and reduces electromagnetic interference leakage.

Further, the first shield layer 30 is electrically connected to one or more through silicon vias 20 of the at least one through silicon via 20, and therefore, the first shield layer 30 is connected, by using the one or more through silicon vias 20, to a ground terminal of an electronic device that is connected to the one or more through silicon vias 20, so that the first shield layer 30 is used as a ground plane and functions as a circuit "ground" and can provide a return current path for the first cable layout layer 50. Therefore, the first shield layer can not only play a role of shielding and reducing electromagnetic wave penetration, but also provide the return current path for the first cable layout layer 50. In addition, the first shield layer 30 is connected to the first cable layout layer 50 by using the one or more through silicon vias 20, and the shield layer functions as the circuit "ground", so that a ground plane may no longer be disposed at the first cable layout layer 50, thereby reducing a quantity of layers of the first cable layout layer 50.

Figure 2:
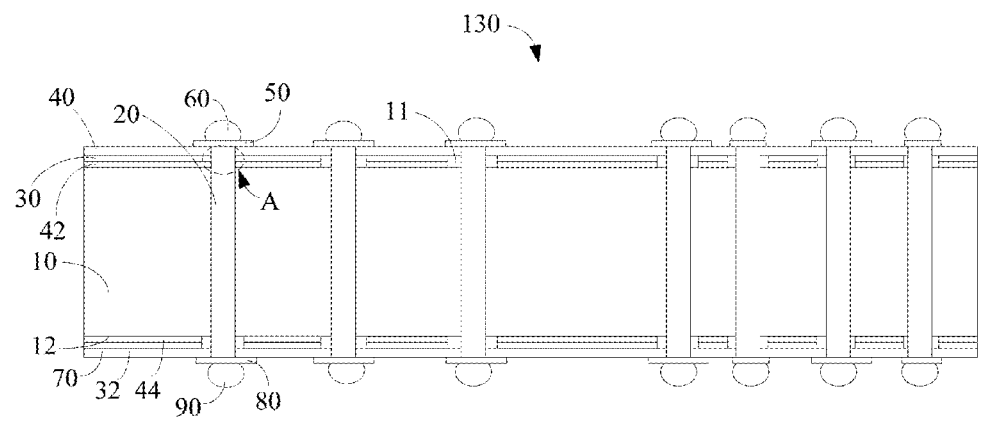
FIG. 2 is a schematic diagram of an interposer according to a second embodiment of the first solution of the disclosure.

Next, referring to FIG. 2, a second exemplary implementation manner of the first solution of the disclosure provides an interposer 130. The interposer 130 according to the second embodiment is similar to the interposer 100 according to the first embodiment, and a difference between the interposer 130 and the interposer 100 is that: in the second embodiment, the interposer 130 further includes a second shield layer 32, a second insulation layer 70, a second cable layout layer 80, and at least one second bump 90.

The second shield layer 32 is disposed on the lower surface 12 of the interposer substrate 10 and the second shield layer 32 has electrical conductivity. In this embodiment, the second shield layer 32 is a metallic shield layer and may be further a metallic copper shield layer.

The second insulation layer 70 is disposed at the second shield layer 32.

The second cable layout layer 80 is disposed at the second insulation layer 70 and is electrically connected to one or more through silicon vias 20 of the at least one through silicon via 20. A function of the second cable layout layer 80 is to implement signal transmission in a horizontal direction.

For the at least one second bump 90, the at least one second bump 90 is disposed at the second cable layout layer 80, so as to be electrically connected to the at least one through silicon via 20 by using the second cable layout layer 80. In this embodiment, the at least one second bump 90 is connected, in a one-to-one corresponding manner, to one or more through silicon vias 20 of the at least one through silicon via 20.

The at least one second bump 90 may be a solder ball or a micro solder ball.

In this embodiment, an interposer 130 includes a first shield layer 30 and a second shield layer 32. The first shield layer 30 is disposed between an upper surface 11 of an interposer substrate 10 and a first cable layout layer 50. The second shield layer 32 is disposed between a lower surface 12 of the interposer substrate 10 and a second cable layout layer 80. That is, the interposer 130 is provided with dual shield layers, which are configured to block and reflect electromagnetic waves generated at the first cable layout layer 50 and the second cable layout layer 80, thereby reducing penetration of an electromagnetic field into the interposer substrate 10 and providing dual-layer shielding, so that integrity of signals transmitted at the first cable layout layer 50 and the second cable layout layer 80 is effectively maintained, and electromagnetic interference leakage is dramatically reduced.

Further, in this embodiment, the first shield layer 30 or the second shield layer 32 is electrically connected to one or more through silicon vias of the at least one through silicon via 20. In this embodiment, the first shield layer 30 is electrically connected to one through silicon via 20, as indicated by location A in FIG. 2. In another embodiment, it may also be that the second shield layer 32 is electrically connected to one through silicon via 20.

It should be noted that, one shield layer of the first shield layer 30 and the second shield layer 32 is electrically connected to one through silicon via 20 of the at least one through silicon via 20 (for example, FIG. 2 shows a case in which the first shield layer 30 is electrically connected to one through silicon via 20), and then the shield layer (for example, the first shield layer 30) is connected, by using the through silicon via 20, to a ground terminal of an electronic device that is connected to the through silicon via 20, so that the first shield layer 30 is used as a ground plane and functions as a circuit "ground" and can provide a return current path for a corresponding cable layout layer (for example, the first cable layout layer 50). Therefore, the shield layer (for example, the first shield layer 30) can not only play a role of shielding and reducing electromagnetic wave penetration, but also provide the return current path for the corresponding layer (for example, the first cable layout layer 50). In addition, the shield layer (for example, the first shield layer 30) is connected to the corresponding cable layout layer (the first cable layout layer 50) by using the through silicon via 20. The shield layer (for example, the first shield layer 30) functions as the circuit "ground", so that a ground plane may no longer be disposed at the corresponding cable layout layer (for example, the first shield layer 30), thereby reducing a quantity of layers of the cable layout layer (for example, the first cable layout layer 50).

Further, the interposer 130 further includes a third insulation layer 42 and a fourth insulation layer 44. The third insulation layer 42 is disposed between the first shield layer 30 and the upper surface 11 of the interposer substrate 10. The fourth insulation layer 44 is disposed between the second shield layer 32 and the lower surface 12 of the interposer substrate 10.

The third insulation layer 42 and the fourth insulation layer 44 include doping ions. Doping densities of the doping ions at the third insulation layer 42 and the fourth insulation layer 44 are greater than $10^{17}/cm^3$.

It should be noted that, the third insulation layer 42 and the fourth insulation layer 44 are disposed between the first shield layer 30 and the interposer substrate 10 and between the second shield layer 32 and the interposer substrate 10, respectively, so that high resistance contact is formed between the interposer substrate and the first shield layer 30 and between the interposer substrate and the second shield layer 32, so as to prevent a conduction phenomenon from occurring between the first shield layer 30 and the interposer substrate 10 and between the second shield layer 32 and the interposer substrate 10, where the conduction phenomenon causes a change in electrical property of the interposer 130, thereby affecting an overall function of the interposer 130.

In addition, in another embodiment, when an interposer is provided with only one shield layer, the interposer may include only one insulation layer, where the insulation layer is disposed between the shield layer and an interposer substrate, so that high resistance contact is formed between the interposer substrate and the shield layer, so as to prevent a conduction phenomenon from occurring between the shield layer and the silicon interposer substrate, where the conduction phenomenon causes a change in electrical property of the interposer, thereby affecting an overall function of the interposer.

Further, the first shield layer 30 and the second shield layer 32 are provided with a hollowed-out part.

It should be noted that, in this embodiment, the interposer substrate 10 is a silicon substrate. A material of the first shield layer 30 and the second shield layer 32 is copper. A large area of copper plated on silicon is prone to fall off because of a difference in coefficient of thermal expansion of the silicon and copper materials. To prevent the first shield layer 30 and the second shield layer 32 from falling off, the first shield layer 30 and the second shield layer 32 are provided with the hollowed-out part.

Specifically, the first shield layer and the second shield layer are of a lattice structure formed by braiding metallic wires, where widths of the metallic wires are greater than 10 um, and a distance between neighboring metallic wires is greater than 0 and less than 100 um.

In another embodiment, to prevent the first shield layer 30 and the second shield layer 32 from falling off, the first shield layer 30 and the second shield layer 32 may also be adjusted to another structure according to an actual need.

Figure 3:
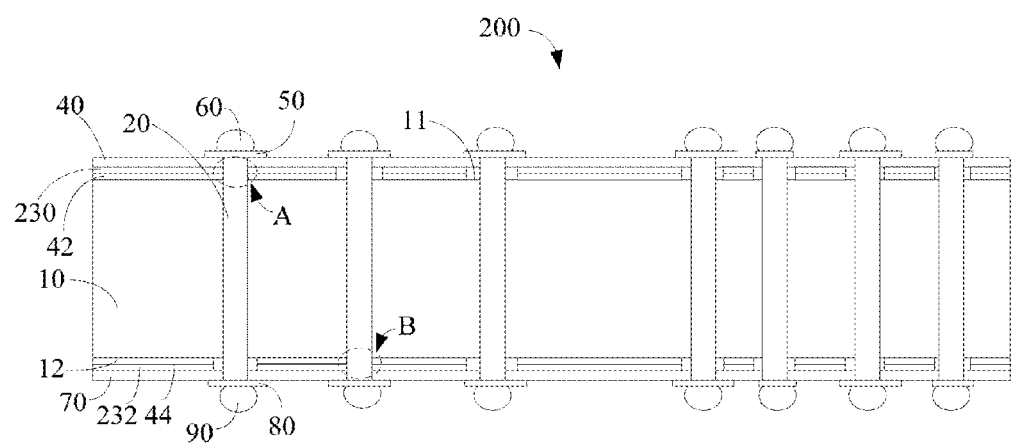
FIG. 3 is a schematic diagram of an interposer according to a third embodiment of the first solution of the disclosure.

Referring to FIG. 3, a third embodiment of the first solution of the disclosure provides an interposer 200. The interposer 200 according to the third embodiment is similar to the interposer 130 according to the second embodiment, and a difference between the interposer 200 and the interposer 130 is that: in the third embodiment, a first shield layer 230 and a second shield layer 232 are separately electrically connected to one or more through silicon vias 20 of the at least one through silicon via 20. The one or more through silicon vias 20 connected to the first shield layer 230 are different from the one or more through silicon vias 20 connected to the second shield layer 232.

In this embodiment, the first shield layer 230 is electrically connected to one through silicon via 20 (as indicated by location A in FIG. 3). The second shield layer 232 is electrically connected to another through silicon via 20 (as indicated by location B in FIG. 3).

The first shield layer 230 and the second shield layer 232 are each electrically connected to one or more through silicon vias 20 of the at least one through silicon via 20, and then the first shield layer 230 and the second shield layer 232 are connected, by using the one or more through silicon vias 20, to a ground terminal of an electronic device that is connected to the one or more through silicon vias 20, so that both the first shield layer 230 and the second shield layer 232 are used as ground planes and function as circuit "grounds" and can provide return current paths for the first cable layout layer 50 and the second cable layout layer 80. Therefore, the first shield layer 230 and the second shield layer 232 can not only play a role of reducing electromagnetic wave penetration, but also provide the return current paths for the corresponding cable layout layers. In addition, the first shield layer 230 and the second shield layer 232 are connected to the corresponding first cable layout layer 50 and the corresponding second cable layout layer 80 by using the one or more through silicon vias 20, and the first shield layer 230 and the second shield layer 232 function as the circuit "grounds", so that a ground plane may no longer be disposed at the corresponding first cable layout layer 50 and the corresponding second cable layout layer 80, thereby reducing quantities of layers of the first cable layout layer 50 and the second cable layout layer 80.

Figure 4:
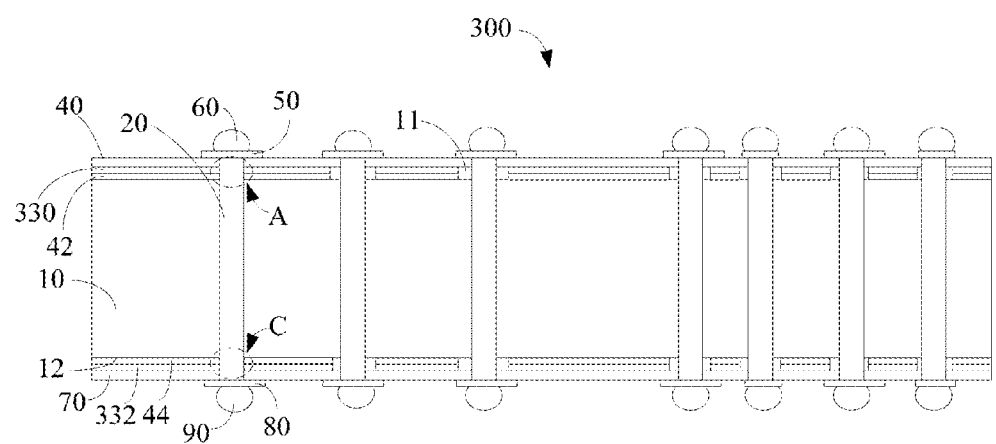
FIG. 4 is a schematic diagram of an interposer according to a fourth embodiment of the first solution of the disclosure.

Referring to FIG. 4, a fourth embodiment of the first solution according to the disclosure provides an interposer 300. The interposer 300 according to the fourth embodiment is similar to the interposer 130 according to the second embodiment, and a difference between the interposer 300 and the interposer 100 is that: in the fourth embodiment, one or more through silicon vias 20 of the at least one through silicon via 20 are electrically connected to both a first shield layer 330 and a second shield layer 332, so that the interposer 300 forms an equipotential body.

In this embodiment, the first shield layer 330 and the second shield layer 332 are both electrically connected to one through silicon via 20 (as indicated by locations A and C in FIG. 4).

In this embodiment, the first shield layer 330 and the second shield layer 332 are both electrically connected to one through silicon via 20, and then the first shield layer 330 and the second shield layer 332 are connected, by using the through silicon vias 20, to a ground terminal of an electronic device that is connected to the through silicon vias 20, so that both the first shield layer 230 and the second shield layer 232 are used as ground planes and function as circuit "grounds" and can provide return current paths for the first cable layout layer 50 and the second cable layout layer 80. Therefore, the first shield layer 230 and the second shield layer 232 can not only play a role of reducing electromagnetic wave penetration, but also provide the return current paths for the corresponding cable layout layers. In addition, the first shield layer 230 and the second shield layer 232 are connected to the corresponding first cable layout layer 50 and the corresponding second cable layout layer 80 by using the through silicon vias 20, and the first shield layer 230 and the second shield layer 232 function as the circuit "grounds", so that a ground plane may no longer be disposed at the corresponding first cable layout layer 50 and the corresponding second cable layout layer 80, thereby reducing quantities of layers of the first cable layout layer 50 and the second cable layout layer 80.

Further, the first shield layer 330 and the second shield layer 332 are connected to a same through silicon via 20, so that the interposer 300 forms an equipotential body, and there is no voltage difference any more, thereby avoiding a loss of a signal that is transmitted in a vertical direction.

Figure 5:
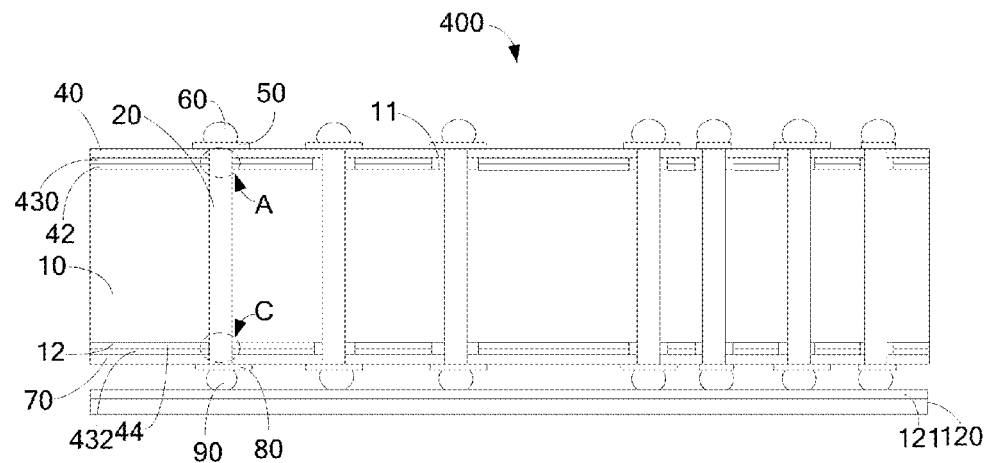
FIG. 5 is a schematic diagram of an interposer according to a fifth embodiment of the first solution of the disclosure.

Referring to FIG. 5, a fifth embodiment of the first solution of the disclosure provides an interposer 400. The interposer 400 according to the fifth embodiment is similar to the interposer 300 according to the fourth embodiment, and a difference between the interposer 400 and the interposer 300 is that: in the fifth embodiment, when the at least one second bump 90 is connected to a ground plane 121 of a printed circuit board 120, one or more through silicon vias 20, of the at least one through silicon via 20, electrically connected to both a first shield layer 430 and a second shield layer 432 are further electrically connected to the ground plane 121.

It should be noted that, the first shield layer 430 and the second shield layer 432 are both electrically connected to the one or more through silicon vias 20, and then the first shield layer 430 and the second shield layer 432 are directly connected, by using the one or more through silicon vias 20, to the ground plane 121, so that both the first shield layer 230 and the second shield layer 232 are used as ground planes and function as circuit "grounds" and can provide return current paths for the first cable layout layer 50 and the second cable layout layer 80. Therefore, the first shield layer 230 and the second shield layer 232 are of simple structures, and can not only play a role of reducing electromagnetic wave penetration, but also provide the return current paths for the corresponding cable layout layers. In addition, the first shield layer 230 and the second shield layer 232 are connected to the corresponding first cable layout layer 50 and the corresponding second cable layout layer 80 by using the one or more through silicon vias 20, and the first shield layer 230 and the second shield layer 232 function as the circuit "grounds", so that a ground plane may no longer be disposed at the corresponding first cable layout layer 50 and the corresponding second cable layout layer 80, thereby reducing quantities of layers of the first cable layout layer 50 and the second cable layout layer 80.

In addition, the first shield layer 330 and the second shield layer 332 are connected to a same through silicon via 20, so that the interposer 400 forms an equipotential body, and there is no voltage difference any more, thereby avoiding a loss of a signal that is transmitted in a vertical direction.

Figure 6:
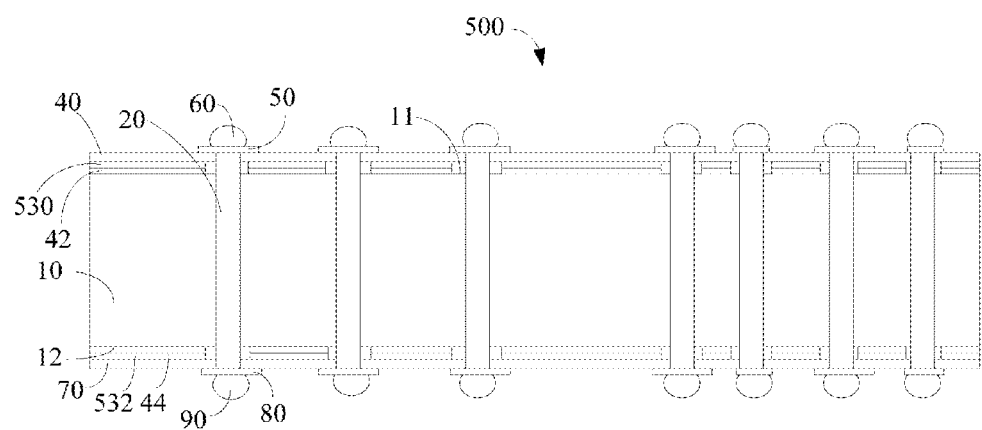
FIG. 6 is a schematic diagram of an interposer according to a sixth embodiment of the first solution of the disclosure.

Referring to FIG. 6, a sixth embodiment of the first solution according to the disclosure provides an interposer 500. The interposer 500 according to the sixth embodiment is similar to the interposer 130 according to the second embodiment, and a difference between the interposer 500 and the interposer 130 is that: in the sixth embodiment, both a first shield layer 530 and a second shield layer 532 are insulated from the at least one through silicon via 20.

In this embodiment, the first shield layer 530 is disposed between the upper surface 11 of the interposer substrate 10 and the first cable layout layer 50, thereby reducing penetration, of an electromagnetic field generated at the first cable layout layer 50, into the interposer substrate 10. The second shield layer 532 is disposed between the lower surface 12 of the interposer substrate 10 and the second cable layout layer 80, and is configured to block and reflect an electromagnetic wave generated at the second cable layout layer 80, thereby reducing penetration, of an electromagnetic field generated at the second cable layout layer 80, into the interposer substrate 10. Therefore, the interposer 500 maintains integrity of a signal and reduces electromagnetic interference leakage.

To further describe beneficial effects of the interposer according to the present application in comparison to a conventional interposer, an interposer of an embodiment of the first solution is selected and simulated. For example, the following comparison results may be obtained by simulating the interposer 130 according to the second embodiment of the first solution.

Figure 7:
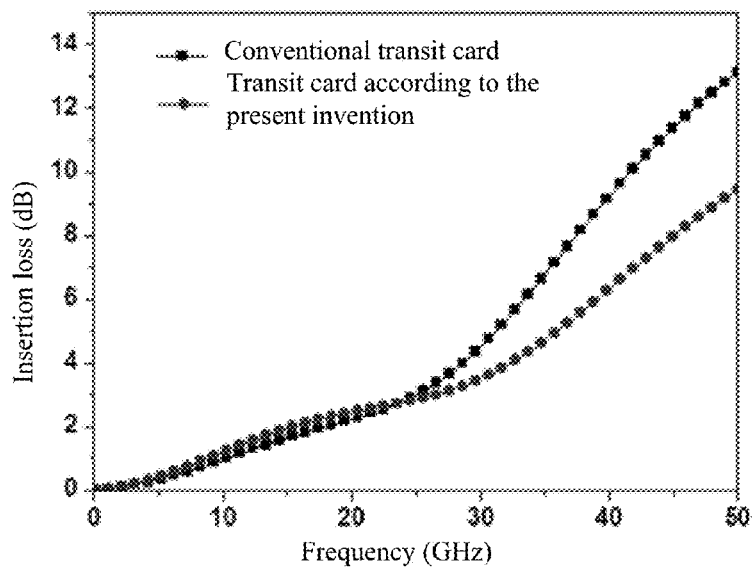
FIG. 7 is a loss comparison simulation diagram obtained by simulating a conventional interposer and an interposer in FIG. 2.

Referring to FIG. 7, FIG. 7 is a loss comparison simulation diagram obtained by simulating a conventional interposer and the interposer 130 according to the second embodiment of the first solution of the disclosure. A total length of a signal cable of the conventional interposer is the same as that of the interposer 130. A signal transmission loss is indicated, by using an insertion loss, as $-20 \log_{10}|S_{21}|$. It can be seen from the figure that, in a high frequency band (20 GHz-50 GHz) range, compared with the conventional interposer, the interposer 130 has a smaller insertion loss. Therefore, it can be learned that a signal transmission loss of a structure of the interposer 130 is small in the high frequency band range.

Figure 8A:
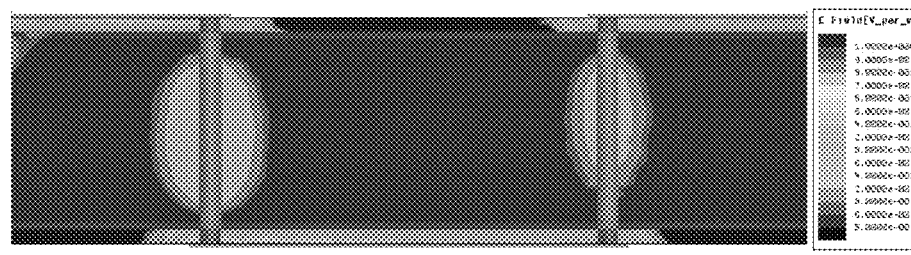
FIG. 8(a) is a distribution diagram of a normalized electric field when a frequency of an interposer in FIG. 2 is 40 GHz.
Figure 8B:
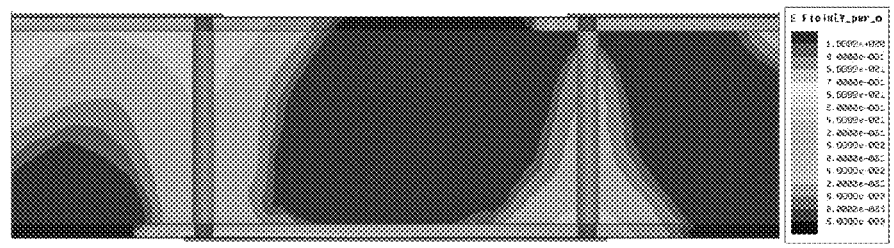
FIG. 8(b) is a distribution diagram of a normalized electric field when a frequency of a conventional interposer is 40 GHz.

Referring to FIG. 8(a) and FIG. 8(b), FIG. 8(a) and FIG. 8(b) are distribution diagrams of normalized electric fields when frequencies of a conventional interposer and the interposer 130 according to the present application are 40 GHz. FIG. 8(a) is a distribution diagram of the normalized electric field when the frequency of the interposer 130 according to the present application is 40 GHz. FIG. 8(b) is a distribution diagram of the normalized electric field when the frequency of the conventional interposer is 40 GHz. It can be seen from FIG. 8(a) and FIG. 8(b) that, compared with the conventional interposer, the interposer 130 according to the disclosure has the following advantage: An electromagnetic field is centralized around a through silicon via and is prevented from spreading to a silicon substrate. Because the conventional interposer is not provided with a shield layer, an electromagnetic field generated when a current passes through a through silicon via spreads in a silicon substrate. The interposer 130 according to some embodiments of the disclosure enables, by using a shield layer and a heavy doping area, a substrate of the interposer 130 to be effectively grounded and forms a structure similar to a coaxial structure together with a through silicon via. In this way, an electromagnetic field that is propagated along a through silicon via can be limited around the through silicon via to a largest extent. It should be emphasized that, the embodiments of the disclosure improve an electrical property of the interposer 130 by means of structure modification but not by using high-resistance silicon that is relatively expensive, thereby facilitating reduction of overall packaging costs of the interposer.

Figure 9:
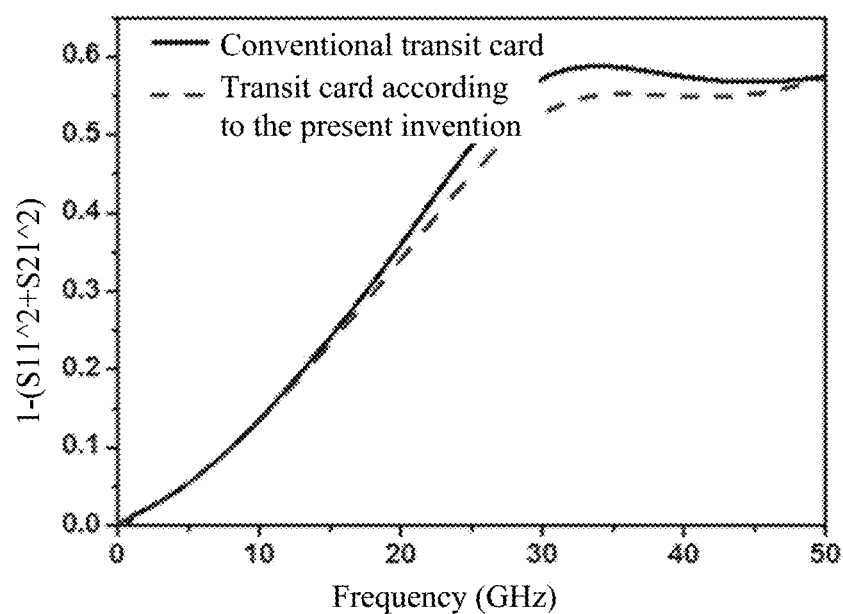
FIG. 9 is a dielectric and metallic loss comparison diagram of an interposer in the drawing and a conventional interposer.

Referring to FIG. 9, FIG. 9 is a dielectric and metallic loss comparison diagram of the interposer 130 according to the present application and a conventional interposer. $|S11|^2$ is a ground-reflected power of a first end of a through silicon via; $|S21|^2$ is a ground-reflected power, passing through the first end, of a second end of the through silicon via. For a lossless dielectric and a non-radiative system, $|S11|^2+|S21|^2=1$. For an interposer provided with a silicon substrate, a dielectric loss is generally greater than a radiation loss, and therefore, $1-(|S11|^2+|S21|^2)$ is used to approximately indicate the dielectric loss. It can be seen from FIG. 9 that, compared with a structure of the conventional interposer, the interposer 130 according to the present application has a smaller dielectric loss.

Figure 10:
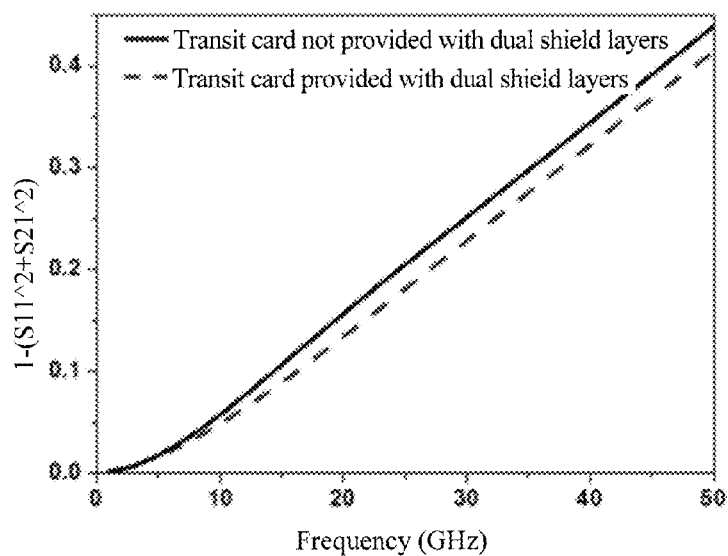
FIG. 10 is a comparison diagram of a loss feature simulation analysis in cases in which an interposer provided with a through silicon via structure is provided with dual shield layers and is not provided with dual shield layers.

In addition, referring to FIG. 10, FIG. 10 is a comparison diagram of a loss feature simulation analysis in cases in which an interposer provided with a through silicon via structure is provided with dual shield layers and is not provided with dual shield layers. It can be seen from FIG. 10 that, when both provided with a through silicon via, an interposer provided with dual shield layers has a smaller dielectric loss in an entire frequency range than an interposer that is not provided with dual shield layers.

Figure 11:
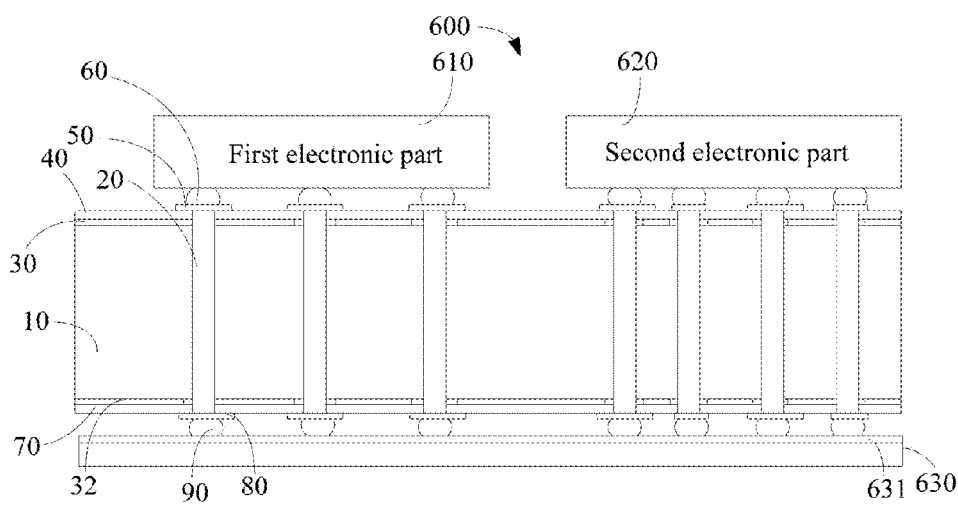
FIG. 11 shows an electronic component according to an embodiment of a second solution of the disclosure.

Referring to FIG. 11, an exemplary embodiment of a second solution of the disclosure provides an electronic component 600. The electronic component includes a first electronic device 610, a second electronic device 620, and an interposer. Both the first electronic device 610 and the second electronic device 620 are disposed on the interposer, to be electrically interconnected by using the interposer. The interposer in this embodiment may be the interposer 100 in the first embodiment of the foregoing first solution. A specific structure and function of the interposer 100 are specifically described in the first embodiment of the first solution, and details are not described herein again.

In another embodiment, the interposer according to any embodiment of the second embodiment to the fifth embodiment of the first solution may be selected as the interposer according to an actual need.

Specifically, at least one first bump 60 includes a first group of first bumps and a second group of first bumps. The first group of first bumps includes one or more first bumps of the at least one first bump. The second group of first bumps includes one or more first bumps of the at least one first bump. The one or more first bumps, of the at least one first bump, included in the first group of first bumps are different from the one or more first bumps, of the at least one first bump, included in the second group of first bumps.

Both the first electronic device 610 and the second electronic device 620 are disposed on top of the interposer 100. The first electronic device 610 is connected to the first group of first bumps. The second electronic device 620 is connected to the second group of first bumps. The first electronic device 610 and the second electronic device 620 are electrically interconnected by using the first group of first bumps, the second group of first bumps, and a first cable layout layer 50.

In this embodiment, an interposer 100 includes a first shield layer 30. The first shield layer 30 is disposed between an upper surface 11 of an interposer substrate 10 and a first cable layout layer 50, and is configured to block and reflect an electromagnetic wave generated at the first cable layout layer 50, thereby reducing penetration, of an electromagnetic field generated at the first cable layout layer 50, into the interposer substrate 10, so that integrity of signals transmitted by a first electronic device 610 and a second electronic device 620 is maintained, and electromagnetic interference leakage is reduced.

In another embodiment, the first electronic device 610 may be disposed on top of the interposer 100 and electrically connected to one or more first bumps 60 of the at least one first bump 60. The second electronic device 620 is disposed at the bottom of the interposer 100 and electrically connected to one or more second bumps 90 of at least one second bump 90. The first electronic device 610 and the second electronic device 620 are electrically interconnected by using the one or more first bumps 60 of the at least one first bump 60, the first cable layout layer 50, a corresponding through silicon via 20, a second cable layout layer 80, and the one or more second bumps 90 of the at least one second bump 90.

Further, the electronic component 600 further includes a printed circuit board 630. The first electronic device 610, the second electronic device 620, and the printed circuit board 630 communicate by using the interposer 100.

Specifically, the at least one second bump 90 is electrically connected to the printed circuit board 630, so that the first electronic device 610 and/or the second electronic device 620 communicate/communicates with the printed circuit board 630 by using the one or more first bumps 60, the first cable layout layer 50, the corresponding silicon via 20, the second cable layout layer 80, and the one or more second bumps 90.

An interposer 100 includes a first shield layer 30. The first shield layer 30 is disposed between an upper surface 11 of an interposer substrate 10 and a first cable layout layer 50. And it is configured to block and reflect an electromagnetic wave generated at the first cable layout layer 50, thereby reducing penetration, of an electromagnetic field generated at the first cable layout layer 50, into the interposer substrate 10, so that integrity of signals transmitted by a first electronic device 610 and a second electronic device 620 is maintained, and electromagnetic interference leakage is reduced.

In addition, the printed circuit board 630 includes a ground plane 631. The first shield layer 430 and the second shield layer 432 are both electrically connected to a through silicon via 20. And then the first shield layer 230 and the second shield layer 232 are directly connected to the ground plane 631 by using the one or more through silicon vias 20, so that both the first shield layer 230 and the second shield layer 232 are used as ground planes and function as circuit "grounds", so as to provide return current paths for the first cable layout layer 50 and the second cable layout layer 80. Therefore, the first shield layer 230 and the second shield layer 232 are of simple structures, and can not only play a role of reducing electromagnetic wave penetration, but also provide the return current paths for the corresponding cable layout layers. In addition, the first shield layer 230 and the second shield layer 232 are connected to the corresponding first cable layout layer 50 and the corresponding second cable layout layer 80 by using the one or more through silicon vias 20. The first shield layer 230 and the second shield layer 232 function as the circuit "grounds", so that a ground plane may no longer be disposed at the corresponding first cable layout layer 50 and the corresponding second cable layout layer 80, thereby reducing quantities of layers of the first cable layout layer 50 and the second cable layout layer 80.

What is disclosed above is merely exemplary embodiments of the disclosure, and certainly is not intended to limit the protection scope of the present application. Any equivalent modification made in accordance with the claims of the present application shall fall within the scope of the present application.

What is claimed is:

1. An interposer comprising:
   a substrate with upper and lower surfaces;
   at least one through silicon via (TSV), buried in the substrate, that runs through the upper and lower surfaces of the substrate;
   an electrically conductive first shield layer disposed on the upper surface of the substrate, wherein the first shield layer is electrically conductive;
   an electrically conductive second shield layer disposed on the lower surface of the substrate;
   a first insulation layer disposed on the first shield layer;
   a second insulation layer disposed on the second shield layer;
   a first cable layout layer disposed on the first insulation layer and electrically connected to one or more through silicon vias of the at least one through silicon via;
   a second cable layout layer disposed on the second insulation layer and electrically connected to one or more through silicon vias of the at least one through silicon via;
   at least one first bump disposed at the first cable layout layer and electrically connected to the at least one through silicon via by using the first cable layout layer; and
   at least one second bump disposed at the second cable layout layer and electrically connected to the at least one through silicon via by using the second cable layout layer.

2. The interposer according to claim 1, wherein the at least one first bump is connected, in a one-to-one corresponding manner, to one or more through silicon vias of the at least one through silicon via.

3. The interposer according to claim 1, wherein the first shield layer is electrically connected to one or more through silicon vias of the at least one through silicon via.

4. The interposer according to claim 1, wherein the first shield layer is insulated from the at least one through silicon via.

5. The interposer according to claim 1, wherein the first shield layer or the second shield layer is electrically connected to one or more through silicon vias of the at least one through silicon via.

6. The interposer according to claim 1, wherein the first shield layer and the second shield layer are electrically connected to one or more through silicon vias of the at least one through silicon via, and the one or more through silicon vias connected to the first shield layer are different from the one or more through silicon vias connected to the second shield layer.

7. The interposer according to claim 1, wherein one or more through silicon vias of the at least one through silicon via are electrically connected to both the first shield layer and the second shield layer, so that the interposer forms an equipotential body.

8. The interposer according to claim 7, wherein when the second bump is connected to a ground plane of the printed circuit board, the one or more through silicon vias electrically connected to both the first shield layer and the second shield layer are further electrically connected to the ground plane.

9. The interposer according to claim 1, wherein both the first shield layer and the second shield layer are insulated from the at least one through silicon via.

10. The interposer according to claim 1, further comprising:
    a third insulation layer disposed between the first shield layer and the upper surface of the interposer substrate; and
    a fourth insulation layer disposed between the second shield layer and the lower surface of the interposer substrate.

11. The interposer according to claim 10, wherein the third insulation layer and the fourth insulation layer comprise doping ions.

12. The interposer according to claim 11, wherein doping densities of the doping ions at the third insulation layer and the fourth insulation layer are greater than $10^{17}/cm^3$.

13. The interposer according to claim 1, wherein the first shield layer and the second shield layer are provided with a hollowed-out part.

14. The interposer according to claim 13, wherein the first shield layer and the second shield layer are of a lattice structure formed by braiding metallic wires, wherein widths of the metallic wires are greater than 10 µm, and a distance between neighboring metallic wires is greater than 0 µm and less than 100 µm.

15. The interposer according to claim 1, wherein the at least one second bump is connected, in a one-to-one corresponding manner, to one or more through silicon vias of the at least one through silicon via.

16. An electronic component comprising first and second electronic parts and an interposer, wherein the first and second electronic devices are disposed on the interposer and electrically interconnected by way of the interposer, the interposer comprising:
   a substrate with upper and lower surfaces;
   at least one through silicon via (TSV), buried in the substrate, that runs through the upper and lower surfaces of the substrate;
   an electrically conductive first shield layer disposed on the upper surface of the substrate;
   an electrically conductive second shield layer; disposed on the lower surface of the interposer substrate;
   a first insulation layer disposed on the first shield layer;
   a second insulation layer disposed on the second shield layer;
   a first cable layout layer disposed on the first insulation layer and electrically connected to one or more through silicon vias of the at least one through silicon via;
   a second cable layout layer disposed on the second insulation layer and electrically connected to one or more through silicon vias of the at least one through silicon via;
   at least one first bump disposed at the first cable layout layer and electrically connected to the at least one through silicon via by using the first cable layout layer; and
   at least one second bump disposed at the second cable layout layer and electrically connected to the at least one through silicon via by using the second cable layout layer.

17. The electronic component according to claim 16, wherein:
   the at least one first bump of the interposer comprises a first group of first bumps including one or more first bumps and a second group of first bumps including one or more first bumps, wherein the one or more first bumps in the first group of first bumps are different from the one or more first bumps in the second group of first bumps; and
   both the first electronic device and the second electronic device are disposed on top of the interposer, wherein the first electronic device is connected to the first group of first bumps, the second electronic device is connected to the second group of first bumps, and the first electronic device and the second electronic device are electrically interconnected by using the first group of first bumps, the second group of first bumps, and the first cable layout layer.

18. The electronic component according to claim 16, wherein:
   the first electronic device is disposed on top of the interposer and is electrically connected to one or more first bumps of the at least one first bump,
   the second electronic device is disposed at the bottom of the interposer and is electrically connected to one or more of the second bumps of the at least one second bump, and
   the first and second electronic devices are electrically interconnected by using the one or more first bumps, the first cable layout layer, a corresponding through silicon via, the second cable layout layer, and the one or more second bumps.

19. The electronic component according to claim 16, further comprising a printed circuit board, wherein the first and second electronic parts and the printed circuit board communicate using the interposer.

* * * * *